US011499845B2

United States Patent
Spevak

(10) Patent No.: US 11,499,845 B2
(45) Date of Patent: Nov. 15, 2022

(54) COMPENSATION OF MECHANICAL TOLERANCE IN A CAPACITIVE SENSING CONTROL ELEMENT

(71) Applicant: TEXAS INSTRUMENTS INCORPORATED, Dallas, TX (US)

(72) Inventor: Peter Spevak, Moosburg an der Isar (DE)

(73) Assignee: Texas Instruments Incorporated, Dallas, TX (US)

( * ) Notice: Subject to any disclaimer, the term of this patent is extended or adjusted under 35 U.S.C. 154(b) by 497 days.

(21) Appl. No.: 16/532,652

(22) Filed: Aug. 6, 2019

(65) Prior Publication Data

US 2020/0256707 A1    Aug. 13, 2020

Related U.S. Application Data

(60) Provisional application No. 62/802,460, filed on Feb. 7, 2019, provisional application No. 62/802,463, filed on Feb. 7, 2019.

(51) Int. Cl.
 *G01D 5/241* (2006.01)
 *H02K 11/28* (2016.01)
(52) U.S. Cl.
 CPC ........... *G01D 5/2412* (2013.01); *H02K 11/28* (2016.01)
(58) Field of Classification Search
 CPC .............................. G01D 5/2412; H02K 11/28
 USPC ........................................................ 324/661
 See application file for complete search history.

(56) References Cited

U.S. PATENT DOCUMENTS

| 4,587,850 | A   | 5/1986  | Moser |
|-----------|-----|---------|-------|
| 6,515,489 | B2* | 2/2003  | Min ..................... G01D 5/2417 324/662 |
| 7,674,993 | B2  | 9/2010  | Jeitner et al. |
| 8,564,313 | B1  | 10/2013 | Ryshtun et al. |
| 8,680,876 | B2* | 3/2014  | Kadono .................. G06F 3/041 324/663 |

(Continued)

FOREIGN PATENT DOCUMENTS

| DE | 4032828 A1  | 4/1991 |
|----|-------------|--------|
| DE | 19808549 A1 | 9/1999 |

(Continued)

OTHER PUBLICATIONS

PCT International Search Report; PCT/US 2020/016178; dated Apr. 23, 2020, 3 pages.

(Continued)

*Primary Examiner* — Judy Nguyen
*Assistant Examiner* — Rahul Maini
(74) *Attorney, Agent, or Firm* — Carl G. Peterson; Charles A. Brill; Frank D Cimino

(57) ABSTRACT

An apparatus includes a first electrode, a second electrode, and a third electrode having first and second opposing surfaces. The first opposing surface is adjacent the first electrode and separated from the first electrode by a first distance, and the second opposing surface is adjacent the second electrode and separated from the second electrode by a second distance. The third electrode is configured to move relative to the first and second electrodes. A capacitance sensing circuit is coupled to the first and second electrodes. The capacitive sensing circuit is configured to determine a capacitance using the first and second electrodes.

20 Claims, 5 Drawing Sheets

(56) References Cited

U.S. PATENT DOCUMENTS

| | | | | |
|---|---|---|---|---|
| 2004/0017209 A1* | 1/2004 | Goto | .................. | G01R 27/2605 |
| | | | | 324/661 |
| 2005/0007125 A1 | 1/2005 | Heger | | |
| 2007/0235272 A1* | 10/2007 | Sieh | ..................... | G01D 5/2412 |
| | | | | 188/266.1 |
| 2014/0300375 A1* | 10/2014 | Kishiro | ................ | G01D 5/2417 |
| | | | | 324/661 |
| 2019/0084144 A1* | 3/2019 | Nieh | ........................ | G01L 5/22 |

FOREIGN PATENT DOCUMENTS

| | | | | | |
|---|---|---|---|---|---|
| DE | 102005043107 A1 * | 3/2007 | .......... | G01D 5/2415 |
| DE | 102005043107 A1 | 3/2007 | | |
| EP | 1428233 A2 | 6/2004 | | |
| EP | 3076136 A1 | 10/2016 | | |
| JP | 11118827 A * | 4/1999 | ........... | G01P 15/125 |
| JP | H 11118827 A1 | 4/1999 | | |
| WO | WO03025958 A2 | 3/2003 | | |
| WO | 2014143065 A1 | 9/2014 | | |

OTHER PUBLICATIONS

Extended European Search Report in European Patent Application No. 20752660.9; dated Feb. 21, 2022, 9 pages.

\* cited by examiner

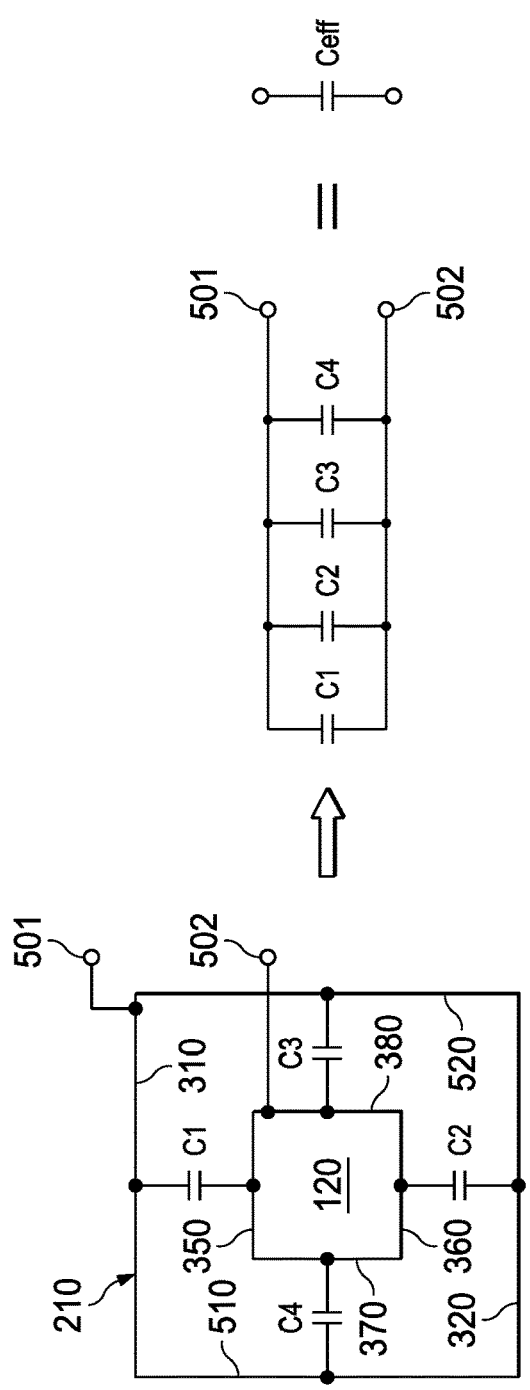
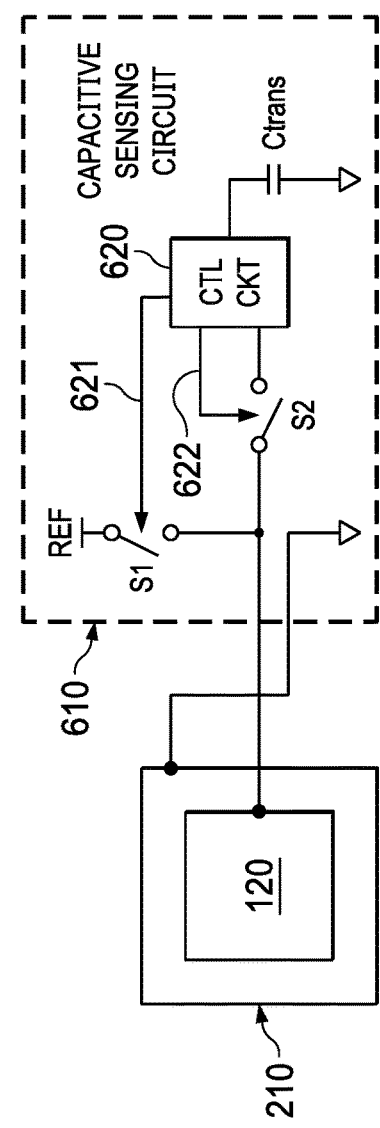
FIG. 5
FIG. 6

COMPENSATION OF MECHANICAL TOLERANCE IN A CAPACITIVE SENSING CONTROL ELEMENT

CROSS-REFERENCE TO RELATED APPLICATIONS

This application claims priority to U.S. Provisional Application No. 62/802,460 and U.S. Provisional Application No. 62/802,463, both filed Feb. 7, 2019, which are hereby incorporated by reference.

BACKGROUND

Many types of machines and devices are operated by a user pulling or pressing a mechanical actuator (e.g., a trigger, a button, etc.). For some equipment, the force with which the user operates the actuator effects the operation of the device. For example, the harder the user pulls the trigger of a drill, the faster the drill's motor is made to spin to increase the speed of the drill bit. Many types of such force-sensitive user-actuated equipment use a resistive actuator to control the operation of the equipment.

SUMMARY

In one example, an apparatus includes a first electrode, a second electrode, and a third electrode having first and second opposing surfaces. The first opposing surface is adjacent the first electrode and separated from the first electrode by a first distance, and the second opposing surface is adjacent the second electrode and separated from the second electrode by a second distance. The third electrode is configured to move relative to the first and second electrodes. A capacitance sensing circuit is coupled to the first and second electrodes. The capacitive sensing circuit is configured to determine a capacitance using the first and second electrodes.

BRIEF DESCRIPTION OF THE DRAWINGS

For a detailed description of various examples, reference will now be made to the accompanying drawings in which:

FIG. 5 shows an electrical model of the electrodes of FIGS. 3 and 4.

FIG. 6 shows an example of a capacitance sensing circuit usable to measure the effective capacitance of the movable and fixed electrodes.

DETAILED DESCRIPTION

The disclosed examples are directed to a capacitance-based sensing technique to operate a device. In one example, a user of the device applies force to an actuator to thereby move the actuator to operate the device. The actuator includes multiple electrically conductive electrodes configured as one or more capacitors. Some of the electrodes are fixed in place within the device, and one of the electrodes moves relative to the fixed electrodes as the user applies force to the actuator. Movement of the movable electrode relative to the fixed electrodes changes the capacitance between the fixed electrodes and the movable electrode. The changing capacitance is determined by a capacitance sensing circuit, and detected changes in capacitance control the operation of the device. The device can be any type of user-actuated device, such as a drill, an angle grinder, electric screwdriver, other types of power tools, appliances, toys, joysticks, etc.

In general, the capacitance between two parallel plates is a function of the ratio of the area of the plates to the distance between the plates (as well as the dielectric constant of the material between the plates). As the movable electrode moves relative to the fixed electrodes, the amount of electrode surface area that overlaps between the fixed electrodes and the movable electrode changes, thereby changing the capacitance. The distance between the movable electrode and the fixed electrodes is nominally a preset distance and does not change. However, due to vibrations of the device and its environment as well as mechanical tolerances, the distance may indeed vary as the movable electrode translates relative to the fixed electrodes. In such situations, not only is the overlapping area of the electrodes changing, but so is the distance between the fixed and movable electrodes. This changing distance alone changes the sensed capacitance and the operation of the device. The examples described herein address this issue.

Figure 1:
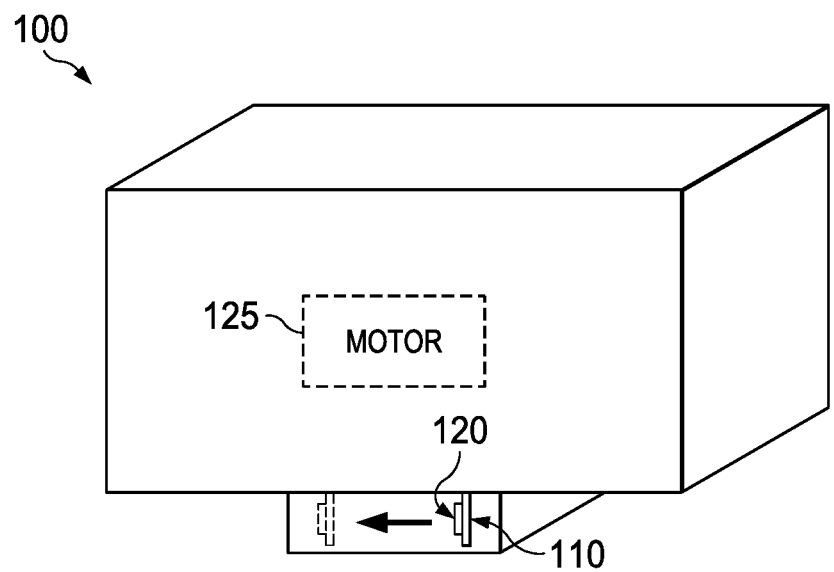
FIG. 1 illustrates a device that includes a capacitive sensing control actuator.

FIG. 1 illustrates a device 100 having an actuator 110. The actuator 110 is moved through application of force. For example, a person may push or pull the actuator 110, which may resist motion due to a spring or other force-resistive mechanism. A movable electrode 120 is coupled to the actuator 110. Thus, as the actuator 110 moves, the movable electrode 120 also moves. The movable electrode 120 moves relative to fixed electrodes, which are not shown in FIG. 1, but are shown in other figures. Movement of the actuator 110 causes the device 100 to perform a function (e.g., drilling). The device 100 in this example includes a motor 125 whose speed is controlled through application of force (e.g., a person's finger)—e.g., the motor's speed is proportional to the amount of force applied to the actuator 110. The movable electrode 120 forms part of a capacitor, whose capacitance changes as the moving electrode moves. The change in capacitance is detected by a capacitive sensing circuit (discussed below), and the change in capacitance causes the function performed by the device 100 to change (e.g., start, stop, increase speed of a motor, decrease speed of the motor, etc.).

Figure 2:
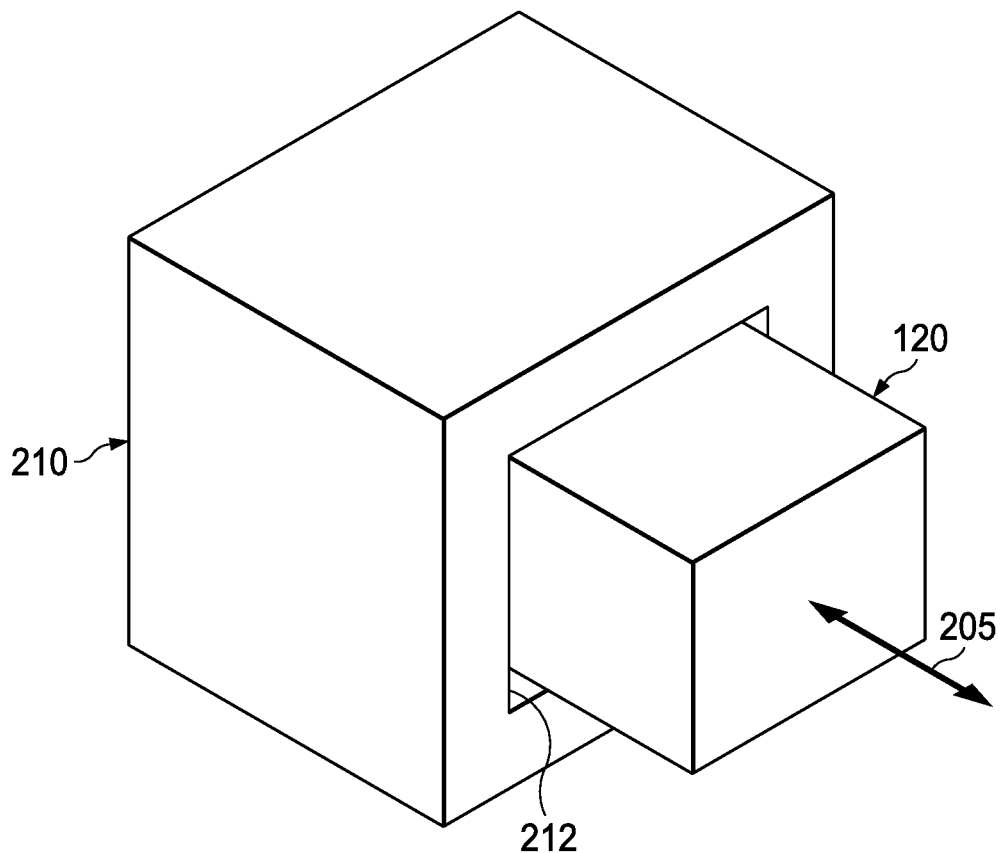
FIG. 2 illustrates that the capacitance sensing control actuator comprises a movable electrode that moves relative to a fixed electrode.

FIG. 2 shows one example of electrodes usable in a capacitive-based sensing technique. Movable electrode 120 moves in the direction of arrow 205 relative to fixed electrode 210. The electrodes 120, 210 are made of, or otherwise coated with an electrically conductive material (e.g., metal). Fixed electrode 210 does not move relative to the device (e.g., device 100) in which it is used. In this example, fixed electrode 210 has a cross-sectional shape that is approximately rectangular (e.g., rectangle or rectangle with rounded corners). In some examples, the rectangular cross-sectional shape is a approximately square. The fixed electrode 210 has an internal cavity 212, and the movable electrode 120 is disposed within the internal cavity 212. The cross-sectional shape of the movable electrode 120 in this example also is approximately rectangular. Other cross-sectional shapes for the movable and fixed electrodes 120, 210 are possible as well (e.g., triangular, oval, circular, etc.).

Figure 3:
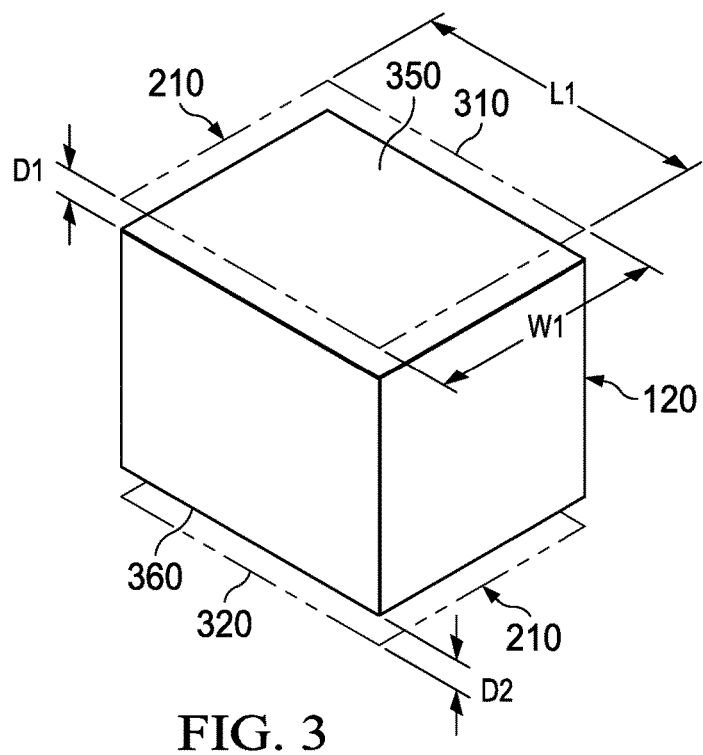
FIGS. 3 and 4 show the movable electrode in two different placements relative to the fixed electrode.
Figure 4:
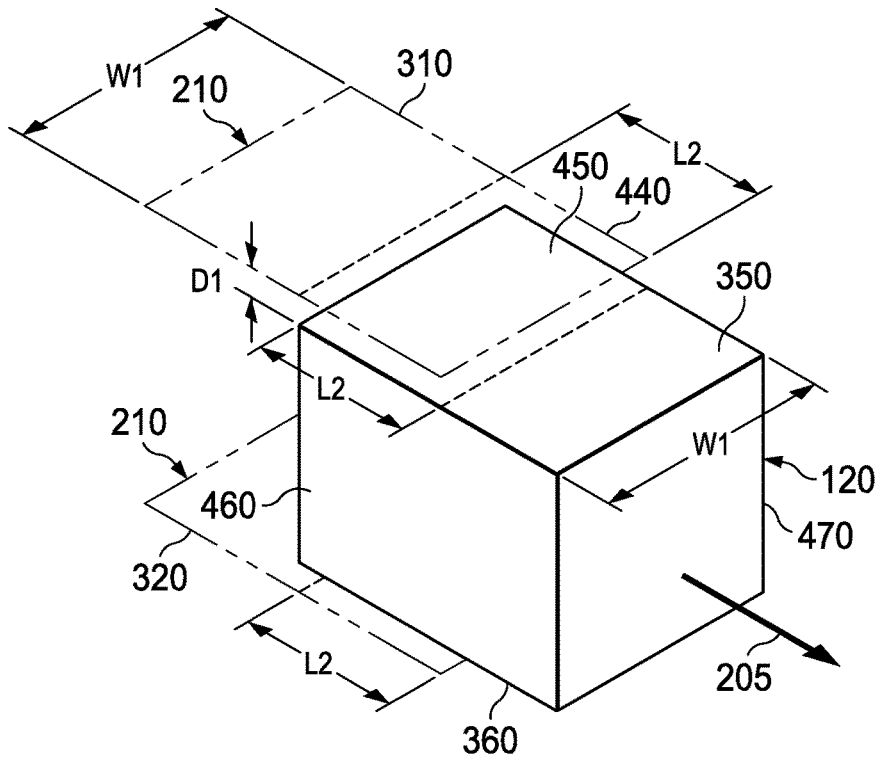

FIGS. 3 and 4 illustrate the positioning of the movable electrode 120 relative to the fixed electrode 210. In these examples, only those surfaces 310 and 320 of the fixed electrode 210 adjacent a pair of opposite surfaces 350 and 360 of movable electrode 120 are shown for convenience. In the arrangement of FIG. 3, the movable electrode 120 is completely within the internal cavity 212 defined by fixed electrode 210 such that approximately the entire surface 310 of the fixed electrode 210 overlaps the entire corresponding surface 350 of the movable electrode 120. The area of the surface 310 is its length L1 multiplied by its width W1 (area=L1×W1). The distance between the surfaces 310 and 350 is D1. The area of the opposing surface 320 is the same as surface 310 (and the area of surfaces 310, 320 can be the same or different than the area of opposing surfaces 350, 360), and the distance D2 between surface 320 and the adjacent surface 360 of movable electrode is nominally the same as well (e.g., D2=D1). The space between the corresponding surfaces 310, 350 and between the corresponding surfaces 320, 360 may be an air gap.

Facing surfaces 310 and 350 represent a pair of parallel plates thereby forming a capacitor. The capacitance of a pair of parallel plates is a function, at least in part, of the ratio of their area to the distance between the plates. With the movable electrode 120 in the position shown in FIG. 3 (completely between the surfaces 310, 320 of the fixed electrode), the capacitance provided by surfaces 310, 350 thus is a function of (L1×W1)/D1.

In FIG. 4, the movable electrode 120 has been moved in the direction of arrow 205, and thus only a portion of the surfaces 350, 360 are between surfaces 310 and 320 of the fixed electrode 210. Specifically, the portion 450 of surface 350 of the movable electrode 120 is covered by a corresponding portion 440 surface 310 of the fixed electrode 210. The portions 440 and 450 have a length of L2 and a width of W1, for an area of each portion 440, 450 of L2×W1. As L2 is less than L1, the area of the capacitors defined by 310/350 and by 320/360 in FIG. 4 is smaller than that in FIG. 3. Another pair of capacitors is implemented between the other pair surfaces 460, 470 (orthogonal to surfaces 350, 360 of movable electrode 120) and the corresponding surfaces (not shown in FIGS. 3 and 4) of the fixed electrode 210.

As the movable electrode 120 moves relative to the fixed electrode 210, the overlapping area between surfaces of the fixed and movable electrodes change. In theory, the distance D1 between the surfaces does not change. However, due to manufacturing tolerances in the dimensions and shapes of the surfaces of the electrodes, tilting of the moving electrode relative to the fixed electrode(s), and/or vibrations experienced by the device 100 containing the electrodes, the distance D1 may indeed vary. For example, as movable electrode 120 moves in the direction of arrow 205, the surface 350 of movable electrode 120 may become closer to surface 310 of fixed electrode 210 (i.e., D1 becomes smaller). A smaller distance between parallel plates of a capacitor tends to cause the capacitance to increase. Of course, the area of the overlapping portions of the plates also changes as the movable electrode 120 moves. Ideally, the capacitance of the parallel plates would only change due to a change in the overlapping plate areas, but in practice, the capacitance unfortunately is also influenced by any changes in D1. As D1 between surfaces 310 and 350 decreases, the distance D2 between surfaces 320 and 360 increases. As such and as further explained below with reference to FIG. 5, any increase in capacitance between surfaces 310 and 350 due just to a decrease in D1 (e.g., electrode 120 becoming closer to or farther away from surface 370) and/or due to an inadvertent tilt of electrode 120 with respect to surfaces 320, 350 as electrode 120 moves relative to surfaces 320, 350 is offset by a corresponding decrease in capacitance between surfaces 320 and 360.

FIG. 5 illustrates a cross-sectional view of fixed electrode 210 and movable electrode 120. Capacitor C1 represents the capacitance formed by facing conductive surfaces 310 and 350, and capacitor C2 represents the capacitance formed by facing conductive surfaces 320 and 360. Capacitors C3 and C4 represent the capacitance formed by adjacent surfaces 510 and 370 (C4 and surfaces 520 and 380 (C3). Electrical contact 501 is connected to fixed electrode 210, and electrical contact 502 is connected to movable electrode 120. FIG. 5 also shows the corresponding electrical model. Capacitors C1-C4 are connected in parallel. The effective capacitance (Ceff) of capacitors in parallel is the sum of the capacitances. If movable electrode's surface 350 becomes closer to surface 310 by a specific amount, surface 360 will become farther from surface 320 by the same amount. Thus, due just to changing distance between conductive surfaces, the capacitance of C2 will decrease by the same amount of increase in capacitance of C1, and the effective capacitance of the parallel combination of C1-C4 will remain the same. Thus, the electrode arrangement automatically compensates for changes in distance between surfaces, and any tilting of the moving electrode relative to the fixed electrode(s).

FIG. 6 illustrates the electrodes 120 and 210 connected to an example capacitive sensing circuit 610. In this example, electrode 210 is grounded and electrode 120 is the sensing electrode connected to the active circuitry of capacitive sensing circuit 610. In another example, electrode 120 is grounded and electrode 210 is connected to the active circuitry of capacitive sensing circuit 610. In this example, the capacitive sensing circuit 610 comprises a control circuit 620, a charge transfer capacitor Ctrans, and switches S1 and S2. The capacitive sensing circuit 620 implements a charge transfer technique to determine the effective capacitance of the two pairs of capacitors C1, C2 and C3, C4 defined by the electrodes 120 and 210. In some examples, control circuit 620 is a finite state machine. Control circuit 620 asserts control signals 621 and 622 to control the open/closed (on/off) state of switches S1 and S2, respectively. When switch S1 is closed and switch S2 is open, the parallel set of capacitors C1-C4 is charged using a reference voltage (REF). During a discharge phase, switch S1 is opened and switch S2 is closed thereby causing the parallel set of capacitors C1-C4 to discharge current through the control circuit 620. The charge from parallel set of capacitors C1-C4 is used to charge the charge transfer capacitor Ctrans. Control circuit 620 calculates the amount of charge transferred between the parallel set of capacitors C1-C4 to the charge transfer capacitor Ctrans. In one example, the number of charge transfer cycles (e.g., using a counter to measure) needed for the voltage on the capacitor Ctrans to reach a predetermined voltage threshold determines the capacitance. In another example, a predetermined/fixed number of charge transfer cycles is performed and the resulting voltage on the capacitor Ctrans is measured (e.g., via an analog-to-digital converter) and mapped to a capacitance value. Other techniques besides charge transfer can be implemented as well to determine the capacitance.

Control circuit 620 then closes switch S1 and opens switch S2 to again charge the parallel set of capacitors C1-C4. Control circuit 620 operates the switches S1 and S2 to repeatedly charge the of parallel set of capacitors C1-C4, and then transfer the charge from the parallel set of capacitors C1-C4 onto charge transfer capacitor Ctrans while determining the amount of charge transferred in each cycle. The amount of charge transferred from the parallel set of capacitors C1-C4 is a function of the effective capacitance Ceff of the set of capacitors, which in turn is a function of the amount of overlapping area of facing surfaces of the electrodes 120 and 210, and the amount of overlapping area is dictated by the relative location of the movable electrode 120 relative to the fixed electrode. Each change/discharge cycle takes a fraction of a second (e.g., hundreds or thousands of charge/discharge cycles each second). A predetermined number of charge/discharge cycles (e.g., 100) may be implemented by control circuit 620 to determine the effective capacitance of the of parallel set of capacitors C1-C4.

Figure 7:
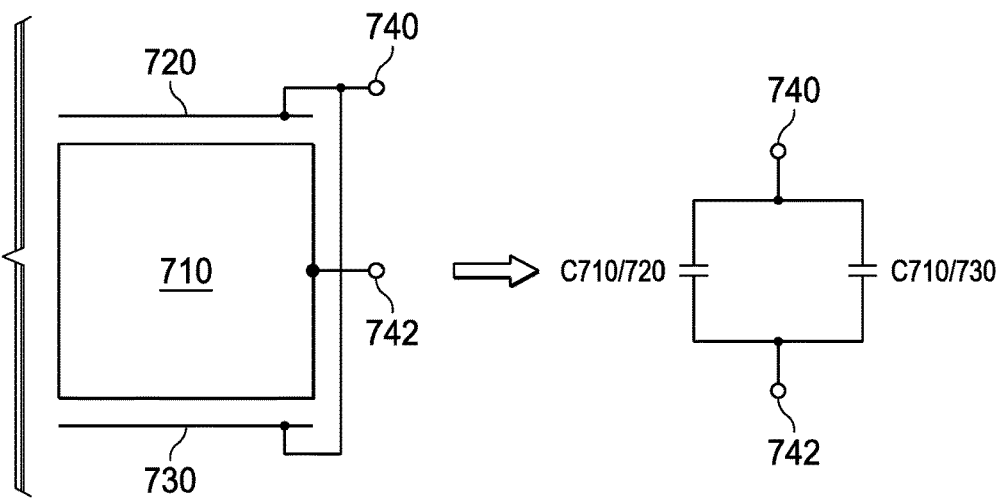
FIG. 7 shows an example including electrode plates on opposite surfaces of the movable electrode, with an electrical connection to the movable electrode.

FIG. 7 shows an example in which a movable electrode 710 is between two separate facing conductive plate electrodes 720 and 730. Plate electrodes 720 and 730 are electrically connected together at connection point 740, and connection point 742 is connected to movable electrode 710. FIG. 7 also shows the corresponding electrical model as capacitor C710/720 (capacitor formed between electrodes 710 and 720) in parallel with capacitor C710/730 (capacitor formed between electrodes 710 and 730). The capacitive sensing circuit as in FIG. 6 can be connected to connection points 740 and 742 to determine the effective capacitance of C710/720 and C710/730.

In the above examples, the movable electrode has an electrical connection to the capacitive sensing circuit 620. In one example, a flexible wire is soldered to the movable electrode with enough slack to allow the electrode to move without breaking the wire or the solder joint. However, it is possible that the solder joint will fail over extended use. As such, in some examples, the movable electrode is permitted to "float," that is, the movable electrode is not directly electrically connected to anything such as the capacitive sensing circuit.

Figure 8:
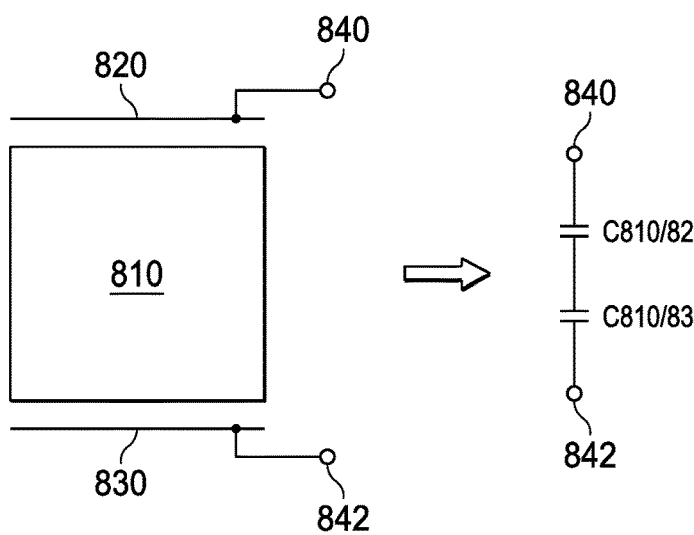
FIG. 8 shows an example including electrode plates on opposite surfaces of the movable electrode, with movable electrode floating.

FIG. 8 shows an example, similar to that of FIG. 7, but an electrical connection is not made to movable electrode 810. Instead, each fixed plate electrode 820 and 830 has its own connection point (connection point 840 for electrode 810, and connection point 842 for electrode 830). The capacitors formed by the parallel plates results in the model shown in FIG. 8 as capacitor C810/820 (capacitor formed between electrodes 810 and 820) connected in series with capacitor 810/830 (capacitor formed between electrodes 810 and 830). Series-connected capacitors have an effective capacitance that is the ratio of the product of their capacitances to the sum of their capacitances. Capacitive sensing circuit 620 can be used to determine the effective capacitance.

Figure 9:
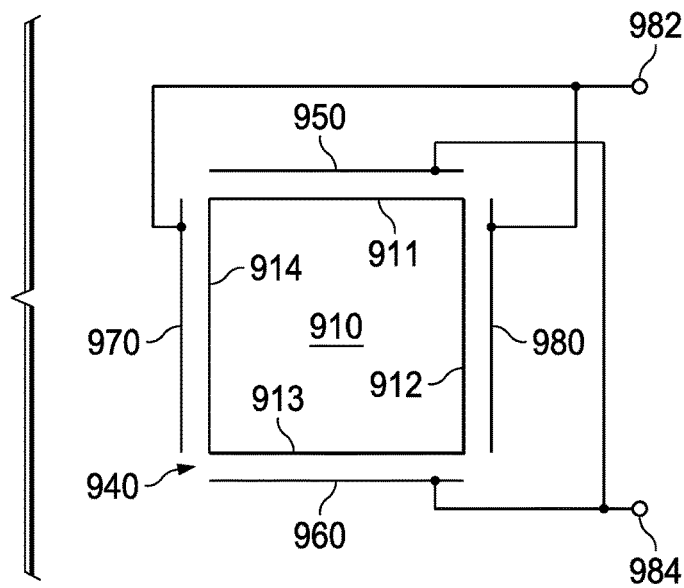
FIG. 9 shows an example of two pairs of electrode plates disposed about the movable electrode.

FIG. 9 shows an example in which four separate fixed electrodes 950, 960, 970, and 980 are disposed about the outer surfaces of a movable electrode 910. In cross-section in this example, the movable electrode 910 is square or rectangular and has four surfaces 910, 911, 912, and 913. Fixed electrode 950 is adjacent surface 911. Fixed electrode 960 is adjacent surface 913. Fixed electrode 970 is adjacent surface 914. Fixed electrode 980 is adjacent surface 912. Enough of a gap 940 exists between each fixed electrode and its respective movable electrode surface so as to form a capacitor. Thus, the combination of the surfaces of movable electrode 910 and the four fixed electrodes 950, 960, 970, and 980 form four capacitors. FIG. 9 also shows that fixed electrodes 970 and 980 are electrically connected together and provide a connection point 982. Similarly, fixed electrodes 950 and 960 are electrically connected together and provide a connection point 984.

Figure 10:
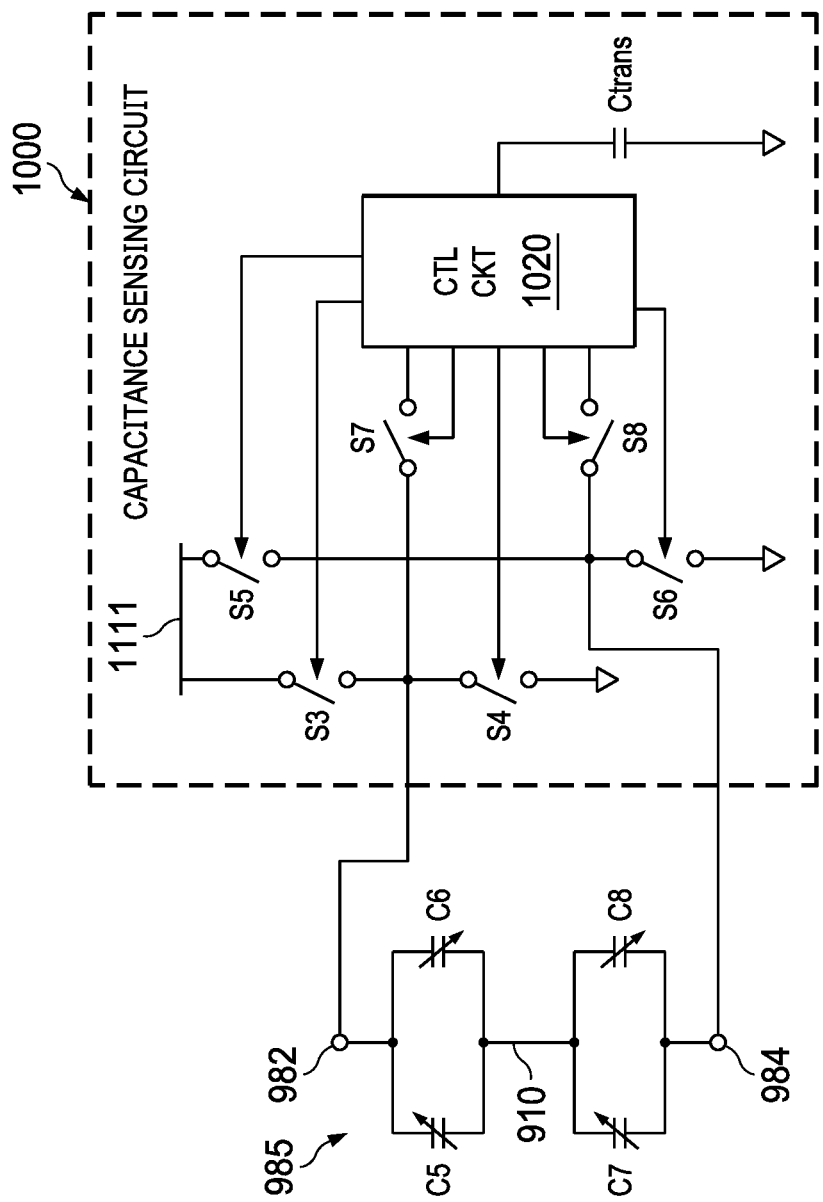
FIG. 10 illustrates the capacitance sensing circuit usable for the electrode configuration of FIG. 9.

FIG. 10 illustrates an electrical model 985 of the four capacitors of FIG. 9 and an example of a capacitance sensing circuit 1000 coupled to connection points 982 and 984 to determine the effective capacitance between connection points 982 and 984. Capacitor C5 represents the capacitance formed by fixed electrode 950 and surface 911 of the movable electrode 910. Capacitor C6 represents the capacitance formed by fixed electrode 960 and surface 913 of the movable electrode 910. Capacitor C7 represents the capacitance formed by fixed electrode 970 and surface 914 of the movable electrode 910. Capacitor C8 represents the capacitance formed by fixed electrode 980 and surface 912 of the movable electrode 910. Capacitors C5 and C6 are connected in parallel. Capacitors C7 and C8 are connected in parallel. The parallel combination of capacitors C5 and C6 is in series with the parallel combination of capacitors C7 and C8 via movable electrode 910. In this example, electrode 910 floats, that is, electrode 910 is not galvanically connected to the capacitance sensing circuit 1000.

The arrows through each pair of capacitors C5/C6 and C7/C8 indicate the change in each capacitor relative to the other capacitor of the parallel pair. For example, due to tilting of the movable electrode 910 relative to the fixed electrodes 850, 960, 970, and 980, as the capacitance of capacitor C5 increases, the capacitance of capacitor C6 decreases, and vice versa. Similarly, as the capacitance of capacitor C7 increases, the capacitance of capacitor C8 decreases, and vice versa.

The effective capacitance between electrode 982 and 910 is:

$$Ceff\_C5\_C6 = C5n + C6n \quad (1)$$

where $$C5n = C5 + \Delta C5 + C5\text{err} \quad (2)$$

where C5 is the capacitance of C5 with the electrodes at a fixed location (e.g., movable electrode 910 at a preset location relative to the fixed electrodes), ΔC5 is the change in C5 due to the movement of movable electrode 910 relative to the fixed electrodes (assuming no tilting), and C5err is the change in C5 due to tilting of the movable electrode 910. C6n is given as:

$$C6n = C6 + \Delta C6 - C6\text{err} \quad (3)$$

where C6 is the capacitance of C6 with the electrodes at a fixed location, ΔC6 is the change in C6 due to the movement of movable electrode 910 relative to the fixed electrodes (assuming no tilting), and C6err is the change in C5 due to tilting of the movable electrode 910. C6err is of the same magnitude of as C5err has an opposite effect on C6n as for C5n as indicated by adding C5err in Eq. (2) but subtracting C6err in Eq. (3). The relationships for C7 and C8 are similar to that described above for C5 and C6. That is, $$Ceff\_C7\_C8 = C5n + C6n \quad (4)$$

$$C7n = C7 + \Delta C7 + C7\text{err} \quad (5)$$

$$C8n = C8 + \Delta C8 - C8\text{err} \quad (6)$$

The capacitance sensing circuit 1000 includes control circuit 1020, charge transfer capacitor Ctrans, and switches S3-S8. The control circuit 1020 asserts control signals to control the on/off state of each of the switches S3-S8. Connection point (which is connected to capacitors C5 and C6) is connected to switches S3, S4, and S7. Connection point 984 is connected to switches S5, S6, and S8. Switches S3 and S5 are also connected to a reference voltage on a reference voltage node 1111 (e.g., dedicated reference voltage with low noise to avoid influencing the capacitance determination), and switches S4 and S6 are connected to a ground node. Control circuit 1020 turns on one of S3 or S4 (but not both simultaneously) to thereby connect capacitors C5 and C6 to the supply voltage or to ground. Similarly, control circuit 1020 turns on one of S5 and S6 (but not both simultaneously) to thereby connect capacitors C7 and C8 to the supply voltage or to ground. In operation, control circuit 1020 can cause connection point 982 to be grounded and connection point 984 to be connected to the reference voltage (node 1111). The control circuit 1020 alternatively can cause connection point 984 to be grounded and connection point 982 to be connected to the reference voltage (node 1111). As such, the series-connected parallel pairs of capacitors can be charged with a supply voltage on connection point 982 and connection point 984 to be grounded, or vice versa.

Once the set of capacitors C5-C8 are charged with connection point 984 grounded (via switch S6) and the supply voltage applied to connection point 982 (via switch S3), switches S3 and S6 are opened by control circuit 1020, and the control circuit 1020 closes switch S7 to discharge the set of capacitors C6-C8 onto the charge transfer capacitor Ctrans. In accordance with any of various charge transfer techniques (such as those described above), the process of using connection point 982 to charge the capacitors and then discharge through Ctans is repeated multiple times (e.g., 100) to obtain a measurement of the effective capacitance between connection points 982 and 984. Then, the control circuit 1020 may repeat the charge/discharge cycles (e.g., 100 times) this time grounding connection point 982 and using connection point 984 to connect to the reference voltage.

The examples of FIGS. 2-10 illustrate outer electrodes with respect to a movable electrode 120, 710, 810, and 910. In other examples, any or all of the "outer" electrodes are internal to the movable electrode. In FIG. 9 any or all of electrodes 950, 960, 970, and 980 can be located within movable electrode 910. For example, electrodes 950 and 960 can be internal to movable electrode, while electrodes 970 and 980 are external, or vice versa. Electrodes 950 and 970 can be internal to movable electrode 910, while electrodes 960 and 980 are external, or vice versa. In some cases, only one of the four electrodes 950, 960, 970, or 980 are internal to movable electrode 910, while the other electrodes are external, or only one electrode is external, while the other three are internal.

In this description, the term "couple" or "couples" means either an indirect or direct wired or wireless connection. Thus, if a first device couples to a second device, that connection may be through a direct connection or through an indirect connection via other devices and connections. Modifications are possible in the described embodiments, and other embodiments are possible, within the scope of the claims.

What is claimed is:

1. An apparatus, comprising:
   a first electrode;
   a second electrode;
   a third electrode having first, second, third, and fourth opposing surfaces, the first opposing surface adjacent the first electrode and separated from the first electrode by a first distance, and the second opposing surface adjacent the second electrode and separated from the second electrode by a second distance, the third electrode configured to move relative to the first and second electrodes, wherein the third electrode comprises a floating electrode;
   a fourth electrode adjacent the third opposing surface and separated from the third opposing surface by a third distance;
   a fifth electrode adjacent the fourth opposing surface and separated from the fourth opposing surface by a fourth distance; and
   a capacitance sensing circuit coupled to the first and second electrodes, the capacitive sensing circuit configured to determine a capacitance using the first and second electrodes.

2. The apparatus of claim 1, wherein the third and fourth opposing surfaces are orthogonally arranged with respect to the first and second opposing surfaces.

3. The apparatus of claim 1, wherein the fourth and fifth electrodes are coupled to the capacitance sensing circuit.

4. The apparatus of claim 1, wherein the third electrode is configured to move relative to the fourth and fifth electrodes.

5. The apparatus of claim 1,
   wherein the first and second electrodes are coupled together at a first node, and
   wherein the fourth and fifth electrodes are coupled together at a second node.

6. The apparatus of claim 5, wherein the capacitance sensing circuit is configured to:
   in a first state, couple the first node to a fixed voltage reference, cause a first voltage to be provided to the second node, and then cause charge to be transferred from the second node to a capacitor; and
   in a second state, couple the second node to the fixed voltage reference, cause the first voltage to be provided to the first node, and then cause charge to be transferred from the first node to the capacitor.

7. The apparatus of claim 1, wherein the capacitance sensing circuit is configured to determine the capacitance through transfer of charge from a first capacitance between the first electrode and the first opposing surface and a second capacitance between the second electrode and the second opposing surface.

8. The apparatus of claim 1, wherein, as the third electrode moves relative to the first and second electrodes, any movement of the first opposing surface towards the first electrode resulting in a decrease in the first distance also results in movement of the second opposing surface away from the second electrode resulting in an increase in the second distance.

9. The apparatus of claim 1, further comprising a motor, and a speed of the motor is controllable based on movement of the third electrode relative to the first and second electrodes.

10. An apparatus, comprising:
    a first fixed electrode;
    a second fixed electrode;
    a third fixed electrode;
    a fourth fixed electrode;
    a fifth movable electrode having first and second opposing surfaces and third and fourth opposing surfaces, the first opposing surface adjacent the first fixed electrode and separated from the first fixed electrode by a first distance, the second opposing surface adjacent the second fixed electrode and separated from the second fixed electrode by a second distance, the third opposing surface adjacent the third fixed electrode and separated from the third fixed electrode by a third distance, the fourth opposing surface adjacent the fourth fixed electrode and separated from the fourth fixed electrode by a fourth distance, the fifth movable electrode configured to move relative to the first, second, third, and fourth fixed electrodes; and a capacitance sensing circuit coupled to the first, second, third, and fourth fixed electrodes, and the capacitive sensing circuit configured to determine a capacitance using the first, second, third, and fourth fixed electrodes, wherein the fifth movable electrode is not electrically connected to the capacitance sensing circuit.

11. The apparatus of claim 10, wherein the fifth movable electrode comprises a floating electrode.

12. The apparatus of claim 10, wherein the first and second fixed electrodes are coupled together at a first node, and the third and fourth fixed electrodes are coupled together at a second node.

13. The apparatus of claim 12, wherein the capacitance sensing circuit is configured to:

in a first state, couple the first node to a fixed voltage reference, cause a first voltage to be provided to the second node, and then cause charge to be transferred from the second node to a capacitor; and in a second state, couple the second node to the fixed voltage reference, cause the first voltage to be provided to the first node, and then cause charge to be transferred from the first node to the capacitor.

14. The apparatus of claim 10, further comprising a motor, and a speed of the motor is controllable based on movement of the fifth movable electrode relative to the first and second fixed electrodes.

15. An apparatus comprising:
a first electrode;
a second electrode;
a third electrode having first and second opposing surfaces,
wherein the first opposing surface is adjacent the first electrode and separated from the first electrode by a first distance,
wherein the second opposing surface is adjacent the second electrode and separated from the second electrode by a second distance,
wherein the third electrode is configured to move relative to the first and second electrodes,
wherein the third electrode comprises a floating electrode, and
wherein, as the third electrode moves relative to the first and second electrodes, any movement of the first opposing surface towards the first electrode resulting in a decrease in the first distance also results in movement of the second opposing surface away from the second electrode resulting in an increase in the second distance; and a capacitance sensing circuit coupled to the first and second electrodes, the capacitive sensing circuit configured to determine a capacitance using the first and second electrodes.

16. The apparatus of claim 15, wherein the third electrode has third and fourth opposing surfaces, the apparatus further comprising:

a fourth electrode adjacent the third opposing surface and separated from the third opposing surface by a third distance; and a fifth electrode adjacent the fourth opposing surface and separated from the fourth opposing surface by a fourth distance, wherein the first and second electrodes are coupled together at a first node, and wherein the fourth and fifth electrodes are coupled together at a second node.

17. The apparatus of claim 16, wherein the capacitance sensing circuit is configured to:

in a first state, couple the first node to a fixed voltage reference, cause a first voltage to be provided to the second node, and then cause charge to be transferred from the second node to a capacitor; and in a second state, couple the second node to the fixed voltage reference, cause the first voltage to be provided to the first node, and then cause charge to be transferred from the first node to the capacitor.

18. The apparatus of claim 16,
wherein the third and fourth opposing surfaces are orthogonally arranged with respect to the first and second opposing surfaces, and
wherein the third electrode is configured to move relative to the fourth and fifth electrodes.

19. The apparatus of claim 15, wherein the capacitance sensing circuit is configured to determine the capacitance through transfer of charge from a first capacitance between the first electrode and the first opposing surface and a second capacitance between the second electrode and the second opposing surface.

20. The apparatus of claim 15, further comprising a motor, and a speed of the motor is controllable based on movement of the third electrode relative to the first and second electrodes.

* * * * *